United States Patent
Ren et al.

(10) Patent No.: US 12,520,620 B2
(45) Date of Patent: Jan. 6, 2026

(54) SOLAR BATTERY, METHOD FOR PREPARING SAME AND USE THEREOF

(71) Applicant: HENGDIAN GROUP DMEGC MAGNETICS CO., LTD., Jinhua (CN)

(72) Inventors: Yong Ren, Jinhua (CN); Yue He, Jinhua (CN); Shuai Guo, Jinhua (CN); Zaifa Wang, Jinhua (CN); Lei Zhang, Jinhua (CN)

(73) Assignee: HENGDIAN GROUP DMEGC MAGNETICS CO., LTD., Jinhua (CN)

(*) Notice: Subject to any disclaimer, the term of this patent is extended or adjusted under 35 U.S.C. 154(b) by 0 days.

(21) Appl. No.: 18/752,826

(22) Filed: Jun. 25, 2024

(65) Prior Publication Data
US 2024/0347649 A1     Oct. 17, 2024

Related U.S. Application Data

(63) Continuation of application No. PCT/CN2023/097552, filed on May 31, 2023.

(30) Foreign Application Priority Data

Apr. 10, 2023    (CN) .......................... 202310376099.4

(51) Int. Cl.
    *H10F 77/30*       (2025.01)
    *H10F 71/00*       (2025.01)

(52) U.S. Cl.
    CPC ......... *H10F 77/311* (2025.01); *H10F 71/129* (2025.01); *H10F 77/315* (2025.01)

(58) Field of Classification Search
CPC ...... H10F 10/14; H10F 71/129; H10F 77/311; H10F 77/315
See application file for complete search history.

(56) References Cited

U.S. PATENT DOCUMENTS

| | | | |
|---|---|---|---|
| 2008/0210303 A1* | 9/2008 | Lu ..................... | B32B 17/10036 |
| | | | 136/265 |
| 2011/0146779 A1* | 6/2011 | Chang .................. | H10F 77/315 |
| | | | 257/431 |

(Continued)

FOREIGN PATENT DOCUMENTS

| CN | 109065639 A | 12/2018 |
|---|---|---|
| CN | 109494261 A | 3/2019 |

(Continued)

OTHER PUBLICATIONS

WO 2009/103929 A2 English Translaiton by FIT database, translated on Jul. 18, 2025.*

(Continued)

*Primary Examiner* — Golam Mowla

(57) ABSTRACT

A solar battery, a method for preparing the same and a use thereof are provided. The solar battery includes a substrate. A side of the substrate is successively provided with an emission layer, a first passivating layer and a first antireflection layer, and the other surface of the substrate is successively provided with a passivating contact structure and a second antireflection layer. A material of the first passivating layer includes gallium oxide. The method for preparing the solar battery includes: successively preparing an emission layer, a first passivating layer and a first antireflection layer on a side of the substrate, and successively preparing a passivating contact structure and a second antireflection layer on the other side of the substrate. The solar battery can be used as a power supply.

19 Claims, 6 Drawing Sheets

(56) References Cited

U.S. PATENT DOCUMENTS

2012/0024370 A1\* 2/2012 Lee ..................... H10F 77/703
                                                     257/E31.13
2021/0217907 A1   7/2021 Chen et al.

FOREIGN PATENT DOCUMENTS

| CN | 114050105 A | 2/2022 | |
|----|----|----|----|
| CN | 217606830 U | 10/2022 | |
| WO | WO-2009103929 A2 \* | 8/2009 | ......... C03C 17/3618 |

OTHER PUBLICATIONS

International Search Report of PCT/CN2023/097552.
1 First Notice of Reasons for Refusal of JP2024-539772.

\* cited by examiner

SOLAR BATTERY, METHOD FOR PREPARING SAME AND USE THEREOF

CROSS-REFERENCE TO RELATED APPLICATIONS

This application is a continuation of international patent application No. PCT/CN2023/097552, filed on May 31, 2023, and titled "SOLAR BATTERY, METHOD FOR PREPARING SAME AND USE THEREOF", which itself claims priority to Chinese patent application No. 202310376099.4, filed on Apr. 10, 2023 and titled "SOLAR BATTERY, METHOD FOR PREPARING SAME AND USE THEREOF". The contents of the above identified applications are hereby incorporated herein in their entireties by reference.

TECHNICAL FIELD

The present disclosure relates to the field of battery technology, in particular to a solar battery, a method for preparing the same and use thereof.

BACKGROUND

As the global energy system is transforming towards low-carbonisation, it is a basic trend to make full use of renewable energy and make conventional energy cleaner and lower-carbon. Accelerating the development of renewable energy has become a mainstream direction of global energy transition, and photovoltaic power generation is one of key areas of the global energy transition. A solar battery is mainly a semi-conductor photo diode having a large area, and is an electron component that directly transfers solar energy into electric energy on the basis of photovoltaic effect. The solar battery can make use of a photoelectric material to absorb luminous energy and transfer the luminous energy into the electric energy by the photoelectric effect. Therefore, solar power is also known as photovoltaic power. A P-type cell material can include a P-type silicon wafer, and an N-type cell material can include an N-type silicon wafer. In related art, a P-type single crystal cell and a P-type polycrystal cell mainly use an aluminum back field technology. A P-type single crystal cell uses PERC (Passivated Emitter and Rear Cell) technology. The PERC technology is simple and has a low cost. As transfer efficiency of the P-type cell approaches a limit of the transfer efficiency of the P-type cell, development of the N-type cell has become a developing trend of the next generation of battery technology. N-type cell has advantages of high transfer efficiency, a high bifacial efficiency, a low temperature coefficient, a longer carrier life time, and the like.

As a key technology of the solar battery, a technology for preparing an N-type TOPCon high efficiency solar battery is important to improve efficiency and lower a cost of the photovoltaic power. Currently, the T-type TOPCon solar battery has a big market, and becomes more and more popular. The TOPCon (Tunnel Oxide Passivating Contacts) battery applies an N-type silicon wafer. In the process of preparing the TOPCon battery, a tunnelling oxide layer having a thickness of 1 nm to 2 nm is prepared on a back surface of the battery, and then a layer of doped polycrystal silicon is deposed on the tunnelling oxide layer, so as to define a passivating contact structure. Thus, a back surface of the silicon wafer is passivated well.

In a process of preparing an efficient TOPCon solar battery in the related art, after the tunnel oxide layer passivating contact structure is prepared, a dielectric passivation layer should be deposed on a front side of the N-type silicon wafer. The dielectric passivation layer is generally an aluminium oxide layer and can provide effective passivation effect. However, although the aluminium oxide does not dissolve in water, the aluminium oxide has a good water-absorbing performance and good adsorption capacity and catalytic activity. Thus, the TOPCon solar battery is easily failed due to invasion of moisture in actual use.

SUMMARY

On the basis of the embodiments of the present disclosure, a solar battery, a method for preparing the same and a use thereof are provided in the present disclosure. In the present disclosure, the solar battery has good reliability and maintains a high transfer efficiency when the solar battery is located under conditions of high temperature and high humidity.

The present disclosure provides a solar battery, which includes a substrate. One side of the substrate is successively provided with an emission layer, a first passivating layer and a first antireflection layer, and the other side of the substrate is successively provided with a passivating contact structure and a second antireflection layer. A material of the first passivating layer includes gallium oxide.

In some embodiments, the solar battery further includes a second passivating layer provided between the passivating contact structure and the second antireflection layer. A material of the second passivating layer includes gallium oxide.

In some embodiments, the passivating contact structure includes a tunnelling oxide layer and a doped polycrystal silicon layer successively disposed. The tunnelling oxide layer is located adjacent to the substrate.

In some embodiments, the first antireflection layer includes a silicon nitride layer, a silicon oxynitride layer, a silicon oxide layer, or any combination thereof. The second antireflection layer includes a silicon nitride layer, a silicon oxynitride layer, a silicon oxide layer, or any combination thereof.

In some embodiments, the first antireflection layer includes a first silicon nitride layer, and the first silicon nitride layer is in contact with the first passivating layer.

In some embodiments, the solar battery further includes a first electrode and a second electrode. The first electrode extends through the first passivating layer and the first antireflection layer and is in contact with the emission layer, and the second electrode extends through the second antireflection layer and is in contact with the passivating contact structure.

Furthermore, the present disclosure further provides a method for preparing a solar battery, which includes the following steps: successively preparing an emission layer, a first passivating layer and a first antireflection layer on one side of the substrate, and successively preparing a passivating contact structure and a second antireflection layer on the other side of the substrate.

In some embodiments, the first passivating layer is prepared by a method selected from an atomic layer deposition method, a plasma enhanced chemical vapour deposition method, and a physical vapour deposition method.

In some embodiments, conditions for preparing the first passivating layer by the atomic layer deposition method includes: under a gas atmosphere of trimethyl gallium and ozone, a volume flow rate of the trimethyl gallium being in a range of 3000 sccm to 12000 sccm, a volume flow rate of the ozone being in a range of 4000 sccm to 12000 sccm, a reaction temperature being in a range of 210° C. to 230° C., and a reaction pressure being in a range of 20 torr to 35 torr. In some embodiments, conditions for preparing the second passivating layer by the atomic layer deposition method includes: a gas atmosphere of trimethyl gallium and ozone, a volume flow rate of the trimethyl gallium being in a range of 3000 sccm to 12000 sccm, a volume flow rate of the ozone being in a range of 4000 sccm to 12000 sccm, a reaction temperature being in a range of 210° C. to 230° C., and a reaction pressure being in a range of 20 torr to 35 torr.

The present disclosure further provides an electrical device, which includes a solar battery described above as a power supply.

Details of one or more embodiments of the present disclosure are presented in the accompanying drawings and description below. Other features, objects, and advantages of the present disclosure will become apparent from the description, the accompanying drawings, and the claims.

BRIEF DESCRIPTION OF THE DRAWINGS

In order to illustrate the embodiments of the present disclosure more clearly, the drawings used in the embodiments will be described briefly. Apparently, the following described drawings are merely for the embodiments of the present disclosure, and other drawings can be derived by those of ordinary skill in the art without any creative effort.

Figure 1:
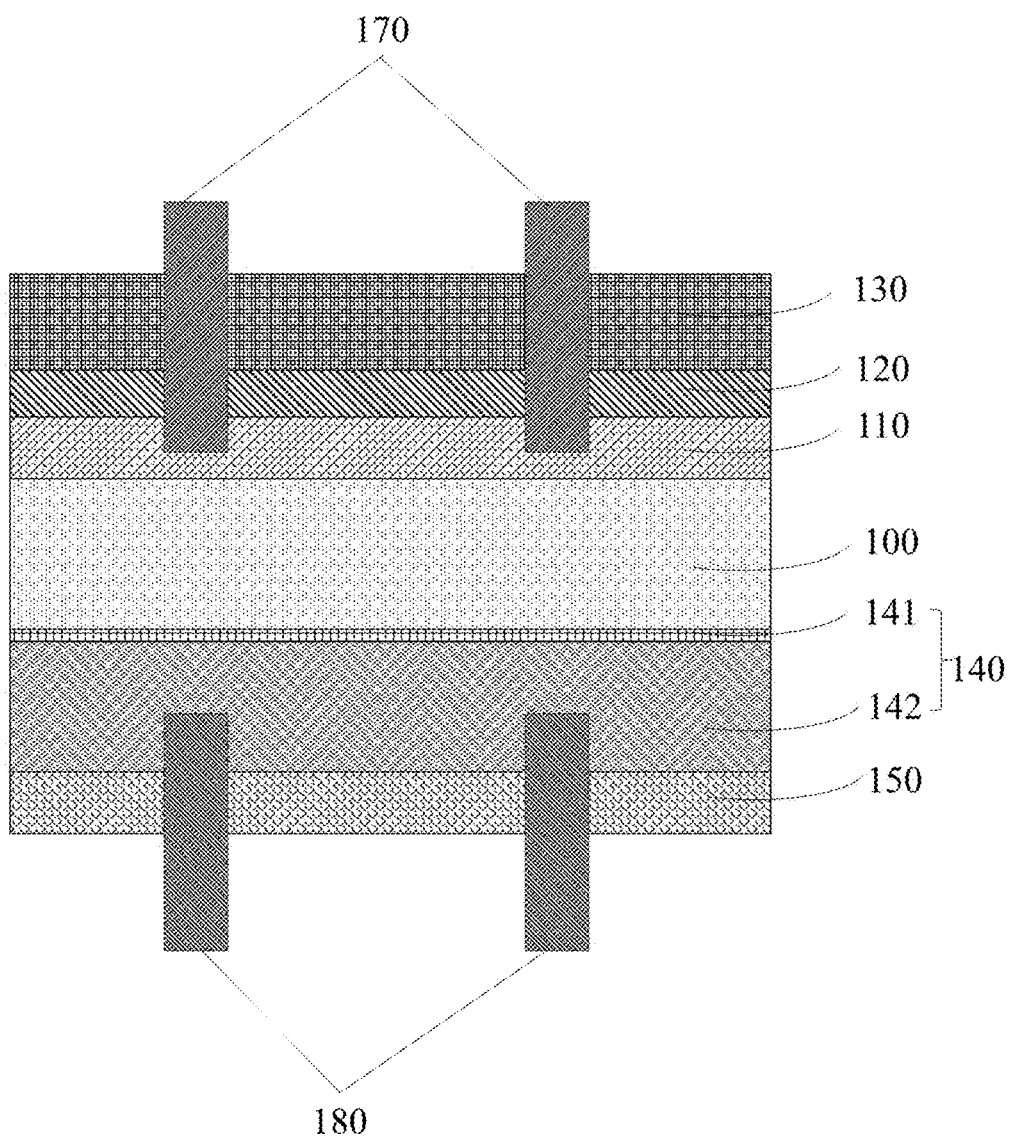
FIG. 1 is a structural schematic diagram of a solar battery in an embodiment of the present disclosure.

In the figures, 10 represents a solar battery; 100 represents a substrate; 110 represents a emission layer; 120 represents a first passivating layer; 130 represents a first antireflection layer; 131 represents a first silicon nitride layer; 132 represents a silicon oxynitride layer; 133 represents a silicon oxide layer; 140 represents a passivating contact structure; 141 represents a tunnelling oxide layer; 142 represents a doped polycrystal silicon layer; 150 represents a second antireflection layer; 151 represents a second silicon nitride layer; 160 represents a second passivating layer; 170 represents a first electrode; and 180 represents a second electrode.

DETAILED DESCRIPTION

The technical solutions in the embodiments of the present disclosure will be clearly and completely described below in conjunction with the accompanying drawings in the embodiments of the present disclosure. Obviously, the described embodiments are only a part of the embodiments of the present disclosure, and not all of the embodiments. Based on the embodiments in the present disclosure, all other embodiments obtained by a person of ordinary skill in the art without making creative labour fall within the scope of protection of the present disclosure.

Furthermore, the terms "first" and "second" are used only for descriptive purposes, and are not to be understood as indicating or implying relative importance or implicitly specifying the number of technical features indicated. Thus, a feature defined with the terms "first", "second" may expressly or implicitly include at least one such feature. In the description of the disclosure, "a plurality of" means at least two, e.g., two, three, etc., unless otherwise expressly and specifically limited. In the description of the present disclosure, "multiple" means at least one, e.g., one, two, etc., unless otherwise expressly and specifically limited.

The words "in some embodiments" and the like in the present disclosure refer to embodiments of the present disclosure that, in some instances, may provide certain beneficial effects. However, other embodiments may be preferred in the same or other circumstances. Moreover, the expression of one or more preferred embodiments does not imply that other embodiments are not available, nor is it intended to exclude other embodiments from the scope of the present disclosure.

When a range of values is disclosed herein, said range is considered to be continuous and includes a minimum value and a maximum value of the range, as well as each value between such minimum and maximum values. Further, when the range refers to an integer, it includes each integer between the minimum and maximum values of the range. In addition, when multiple ranges are provided to describe a characteristic or feature, the ranges may be combined. In other words, unless otherwise indicated, all ranges disclosed herein should be understood to include any and all sub-ranges subsumed therein.

In describing positional relationships, unless otherwise specified, when an element such as a layer, membrane, or substrate is referred to as being disposed "on" another membrane layer, it can be directly on the other membrane layer or an intermediate membrane layer can also be present. Further, when a layer is said to be disposed "under" another layer, it may be directly underneath, or one or more intermediate layers may be present. It will also be appreciated that when a layer is referred to as being disposed "between" two layers, it may be the only layer between the two layers, or one or more intermediate layers may be present.

Where "comprising", "having", and "including" are used as described herein, the intent is to cover non-exclusive inclusion unless explicitly qualified terms are used. For example, "only", "comprising . . . ", etc., another component may be added.

Unless mentioned to the contrary, a term in the singular form may include the plural form and is not to be understood as numbering one.

Unless otherwise defined, all technical and scientific terms used herein have the same meaning as commonly understood by those skilled in the art belonging to the present disclosure. Terms used herein in the specification of the present disclosure are used only for the purpose of describing specific embodiments and are not intended to limit the present disclosure. The term "and/or" as used herein includes any and all combinations of one or more of the relevant listed items.

Referring to FIG. 1, the present disclosure provides a solar battery 10, which includes a substrate 100. One side of the substrate 100 is successively provided with an emission layer 110, a first passivating layer 120 and a first antireflection layer 130, and the other side of the substrate is successively provided with a passivating contact structure 140 and a second antireflection layer 150. A material of the first passivating layer 120 includes gallium oxide.

In the present disclosure, the gallium oxide is used as a material of a passivating layer. A material of the passivating layer has a low interface state density and a high fixed amount of negative charges. Thus, a front side of the TOPCon solar battery can have a relatively strong interface field passivation effect, and transfer efficiency of the TOPCon solar battery can be high. In addition, the material of the passivating layer has good water stability, which can effectively avoid failure of the solar battery caused by increasing contact resistance after the passivating layer absorbing water.

Figure 2:
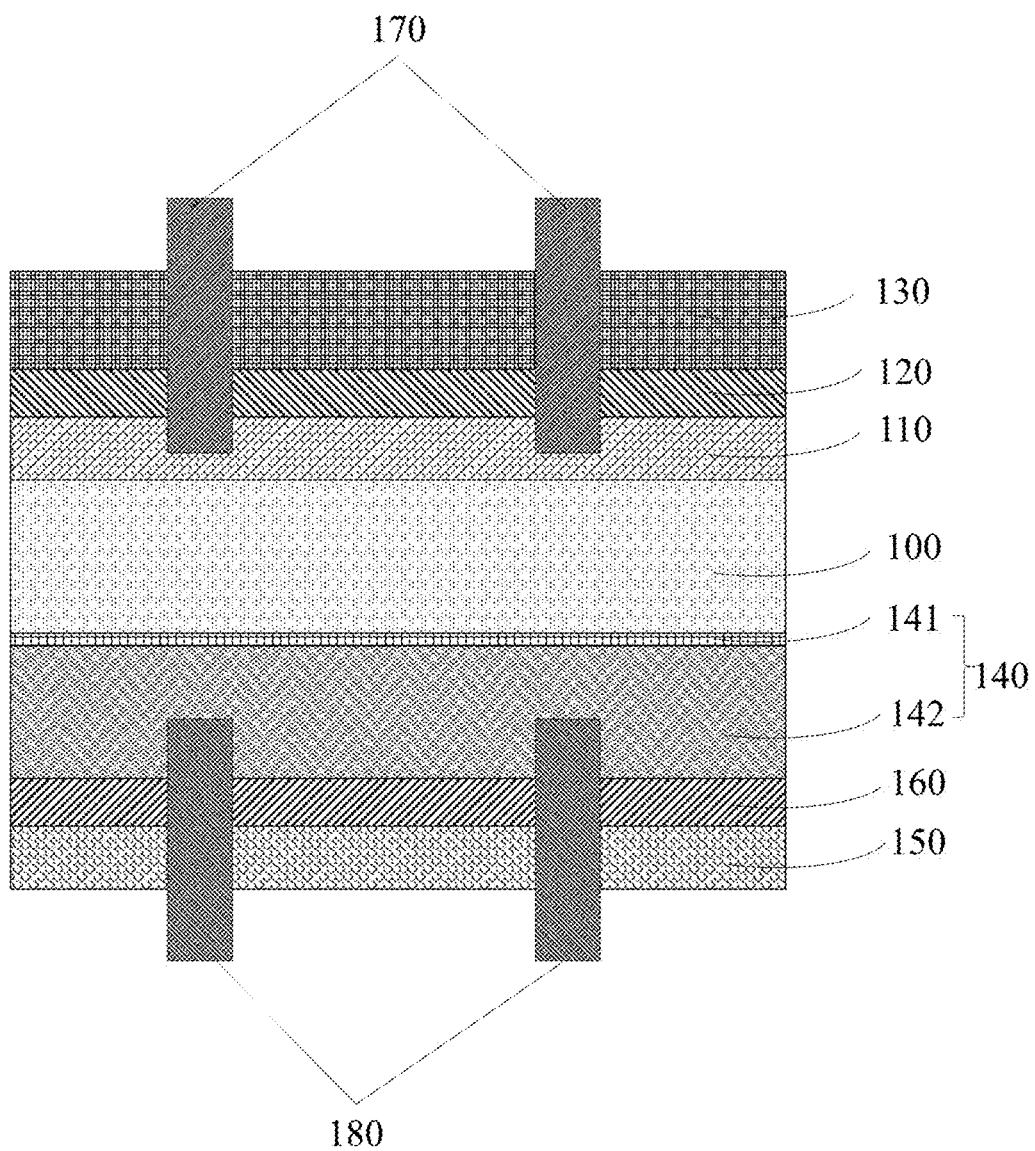
FIG. 2 is a structural schematic diagram of a solar battery in an embodiment of the present disclosure.

In some embodiments, referring to FIG. 2, the solar battery further includes a second passivating layer 160. A material of the second passivating layer 160 includes gallium oxide.

In some embodiments, the material of the first passivating layer 120 and the material of the first passivating layer 120 can be one-dimensional $\beta$-$Ga_2O_3$.

Furthermore, the passivating layer made of gallium oxide can effectively absorb ultraviolet light, improve stability of a bond energy of $H^+$ bond after the solar battery is exposed under the sun in the outdoor after a long time, improve stability of $H^+$ passivation, and effectively avoid the problem of failure of the solar battery caused by the strong ultraviolet light. It could be understood that the $H^+$ bond herein represents the $H^+$ bonds generated in the reaction between $SiH_4$, $NH_3$ and $(CH_3)_3Ga$.

In some embodiments, the passivating contact structure 140 includes a tunnelling oxide layer 141 and a doped polycrystal silicon layer 142. The tunnelling oxide layer 141 and the doped polycrystal silicon layer 142 care successively disposed. The tunnelling oxide layer 141 is located adjacent to the substrate 100. In some embodiments, the tunnelling oxide layer 141 is in contact with the substrate 100.

It could be understood that the substrate 100 is a silicon substrate 100 having a first conductivity type, the emission layer 110 has a second conductivity type, and the doped polycrystal silicon has a first conductivity type. In some embodiments, the first conductivity type is N-type, the second conductivity type is P-type. In some embodiments, the first conductivity type is P-type, and the second conductivity type is N-type.

Furthermore, the substrate 100 has a first conductivity type. An emission layer 110 having a second conductivity type is prepared by doping the substrate 100 by method of boron diffusion. A doped polycrystal silicon layer 142 is prepared by doping phosphorus to the polycrystal silicon.

Furthermore, the tunnelling oxide layer 141 is a silicon oxide layer.

In some embodiments, the first antireflection layer 130 includes at least one selected from the group consisting of a silicon nitride layer, a silicon oxynitride layer, and a silicon oxide layer. The second antireflection layer includes at least one selected from the group consisting of a silicon nitride layer, a silicon oxynitride layer, and a silicon oxide layer.

In some embodiments, the first antireflection layer 130 includes at least one selected from the group consisting of a first silicon nitride layer 131, a silicon oxynitride layer 132, and a silicon oxide layer 133. In some embodiments, the first antireflection layer 130 includes a first silicon nitride layer 131, and the first silicon nitride layer 131 is in contact with the first passivating layer 120.

In some embodiments, the second antireflection layer 150 includes a second silicon nitride layer 151. In some embodiments, the second silicon nitride layer is in contact with the second passivating layer 160.

It could be understood that a stacked structure including a first passivating layer 120 made of gallium oxide and a first antireflection layer 130 of a first gallium nitride layer provided on the first passivating layer 120 can improve chemical passivation and field passivation on a surface of the battery, so as to effectively improve a service life of minority carriers of the solar battery and the transfer efficiency of the solar battery.

In some embodiments, the solar battery further includes a first electrode 170 and a second electrode 180. The first electrode 170 extends through the first passivating layer 120 and the first antireflection layer 130 and is in contact with the emission layer 110, and the second electrode 180 extends through the second antireflection layer 150 and is in contact with the passivating contact structure 140.

Furthermore, a material of the first electrode 170 includes silver, aluminium, and gold; and a material of the second electrode 180 includes silver, aluminium, and gold.

It could be understood that if the metal electrode is made of silver and aluminium, the metal electrode is generally made by a method of silk-screen printing with a metal paste. If the passivating layer is easily to absorb water, an alloy made of the metal paste is easily oxidized, thereby making the contact resistance increase and failure of the battery. Thus, providing the passivating layer made of a material having good water stability can effectively avoid sensitivity of the TOPCon solar battery to conditions of high temperature and high humidity, and improve stability of the battery.

Furthermore, the present disclosure further provides a method for preparing a solar battery, which includes the following steps: successively preparing an emission layer 110, a first passivating layer 120 and a first antireflection layer 130 on a side of the substrate 100, and successively preparing a passivating contact structure 140 and a second antireflection layer 150 on the other side of the substrate 100.

It could be understood that one side of the silicon wafer having a first conductivity type can be subjected to a texturing process, so as to remove hurts and impurities on the surface of the silicon wafer generated in a process of cutting an original silicon wafer, increase an area of a junction area, and increase a surface area of a battery piece. A reflectivity of the surface of the battery piece can be lowered by light trapping principle. One side or both sides of the substrate 100 can be subjected to the texturing process according to actual needs. In some embodiments, the silicon wafer is N-type.

Furthermore, one side, i.e., a front side of the substrate 100 is subjected to a second conductivity type atomic diffusion to preparing a second conductivity type emission layer 110, and then subjected a laser doping process. In some embodiments, the front side of the substrate 100 is subjected to boron diffusion. In the boron diffusion process, $BCl_3$ is used as a boron source, and the boron diffusion is carried out under conditions of 950° C.-1000° C.

It could be understood that a boron diffusion selective emitter (SE) battery is a kind of battery that a heavy doping process is carried out on a contact area (a contact area of the electrode) between metal grid lines on the boron diffusion surface and the silicon wafer, and a light doping process is carried out between a non-metal contact area and the metal electrode. The structure can effectively reduce a contact resistance and metal recombination of the metal area, and improve an open-circuit voltage. At the same time, in the non-metal contact area, i.e., light doping area, auger recombination is lowered and quantum efficiency of short waves is effectively increased, so that a short-circuit current is increased.

Furthermore, after the laser doping process, the doped area can be further subjected to a high-temperature processing, so as to subject the doped area to a high-temperature repairing process.

In some embodiments, after the high-temperature repairing process, a chain method is applied to remove borosilicate glass (BSG) wrapped on an edge of the substrate 100 and the other side, i.e., the back side, of the substrate 100. After the treatment, the back side of the substrate 100 is subjected to a groove-type polishing process, so that the edge of the substrate 100 and the back side of the substrate 100 is subjected to an alkali corrosion process to remove the wrapped borosilicate glass and polish the backside of the substrate 100.

Furthermore, after the above steps, a tunnelling oxide layer 141 and a polycrystal silicon layer are successively prepared on the other side, i.e., the back side of the silicon wafer. Specifically, the tunnelling oxide layer 141 and the polycrystal silicon layer can be a silicon oxide layer. The silicon oxide layer can be prepared by, but not limited to a low pressure chemical vapour deposition method (LPCVD). Furthermore, the polycrystal silicon layer on the back side of the silicon wafer can be subjected to a phosphorus diffusion doping process to prepare a doped polycrystal silicon layer 142, and then subjected to a annealing treatment to subject the polycrystal silicon to a crystallization treatment.

In some embodiments, after the phosphorus diffusion and the annealing treatment, the phosphosilicate glass (PSG) wrapped on the edge of the silicon wafer and the other side, i.e., the front side, of the substrate 100 is removed by the chain method. Then, the substrate 100 is subjected to a groove-type polishing process to remove the polycrystal silicon and an industrial standard wet cleaning process (i.e., RCA cleaning process). The substrate 100 is subjected to an alkali polishing process to remove the polycrystal silicon wrapped on the edge of the substrate 100 and the front side of the substrate 100, and the BSG on the front side of the substrate 100 is be removed with hydrofluoric acid.

In some embodiments, a step of preparing a second passivating layer 160 on the passivating structure is included before preparing the second antireflection layer 150.

In some embodiments, a method for preparing the first passivating layer 120 is a method selected from an atomic layer deposition method, a plasma enhanced chemical vapour deposition method or a physical vapour deposition method.

Furthermore, the first passivating layer 120 and the second passivating layer 160 are prepared by method selected from an atomic layer deposition method, a plasma enhanced chemical vapour deposition method or a physical vapour deposition method.

In some embodiments, the first passivating layer 120 and the second passivating layer 160 are prepared by method of atomic layer deposition (ALD) with trimethyl gallium and oxide-containing materials.

In some embodiments, the method for preparing the first passivating layer 120 and the second passivating layer 160 by the atomic layer deposition method includes the following steps: conveying a reaction boat into a device; vacuuming for the first time; heating to a processing temperature and isolating; checking to make sure that the device is not leaky; pre-ventilation; depositing trimethyl gallium; thermal decomposition reaction of the trimethyl gallium; sweeping the trimethyl gallium; a first constant temperature process; depositing ozone; thermal decomposition reaction of the ozone; sweeping the ozone; a second constant temperature process; vacuuming for the second time; cleaning the furnace tube; recovering a pressure in the furnace tube to an ordinary pressure; and conveying the reaction boat out of the device.

In some embodiments, a method for preparing gallium oxide passivating layer with different thicknesses includes circulations of the following steps: depositing trimethyl gallium; thermal decomposition reaction of the trimethyl gallium; sweeping the trimethyl gallium; a first constant temperature process; depositing ozone; thermal decomposition reaction of the ozone; sweeping the ozone; and a second constant temperature process. The number of the circulations is designed according to actual needs. The number of the circulations is in a range of 20 times to 40 times. In some embodiments, the number of the circulations is in a range of 25 times to 35 times. In some embodiments, the number of the circulations can be, but not limited to 25 times, 26 times, 27 times, 28 times, 29 times, 30 times, 31 times, 32 times, 33 times, 34 times or 35 times.

In some embodiments, conditions for preparing the first passivating layer 120 by the atomic layer deposition method includes: a gas atmosphere of trimethyl gallium and ozone, a volume flow rate of the trimethyl gallium in a range of 3000 sccm to 12000 sccm, a volume flow rate of the ozone in a range of 4000 sccm to 12000 sccm, a reaction temperature in a range of 210° C. to 230° C., and a reaction pressure in a range of 20 torr to 35 torr. In some embodiments, conditions for preparing the second passivating layer 160 by the atomic layer deposition method includes: a gas atmosphere of trimethyl gallium and ozone, a volume flow rate of the trimethyl gallium in a range of 3000 sccm to 12000 sccm, a volume flow rate of the ozone in a range of 4000 sccm to 12000 sccm, a reaction temperature in a range of 210° C. to 230° C., and a reaction pressure in a range of 20 torr to 35 torr.

In some embodiments, conditions of conveying the reaction boat into the device includes: conveying the silicon wafer into the device, setting a reaction time in a range of 100 s to 140 s, and setting a temperature in a range of 230° C. to 270° C.

In some embodiments, conditions of vacuuming for the first time includes the following steps: setting a reaction time in a range of 180 s to 240 s, setting a temperature in a range of 200° C. to 240° C., and setting the pressure in the device in a range of 25 torr to 35 torr after vacuuming for the first time.

In some embodiments, conditions of the thermal isolation process after heating to the processing temperature includes: subjecting the device to a vacuuming process again to a preset processing value. A time of the thermal isolation is set in a range of 280 s to 340 s, a temperature of the thermal isolation is in a range of 200° C. to 240° C., and a pressure in the device after the vacuuming process is in a range of 25 torr to 35 torr.

Then the device was checked to make sure that the device is not leaky. Thus, a processing effect can be guaranteed. A time of the checking is set in a range of 18 s to 24 s, a temperature of the checking is set in a range of 200° C. to 240° C., and a pressure of the checking is in a range of 25 torr to 35 torr.

The device is subjected to a pre-ventilation process. In the pre-ventilation process, a time of the pre-ventilation is set in a range of 8 s to 14 s, a flow rate of trimethyl gallium (TMGa) is in a range of 8000 sccm to 12000 sccm, and a flow rate of ozone ($O_3$) is in a range of 8000 sccm to 12000 sccm.

Deposition of trimethyl gallium is carried out under the following conditions. A flow rate of the trimethyl gallium is in a range of 3000 sccm to 8000 sccm, a pressure of the deposition is in a range of 20 torr to 30 torr, a temperature of the deposition is set in a range of 210° C. to 230° C., and a time of the deposition is in a range of 2000 ms to 6000 ms.

In some embodiments, deposition of trimethyl gallium is carried out under the following conditions. A flow rate of the trimethyl gallium is in a range of 4000 sccm to 6000 sccm, a pressure of the deposition is in a range of 22 torr to 27 torr, a temperature of the deposition is set in a range of 215° C. to 225° C., and a time of the deposition is in a range of 3000 ms to 5000 ms.

Thermal decomposition reaction of the trimethyl gallium is carried out under the following conditions. A pressure of the thermal decomposition reaction is in a range of 20 torr to 30 torr, a temperature of the thermal decomposition reaction is set in a range of 210° C. to 230° C., and a time of the thermal decomposition reaction is set in a range of 2000 ms to 5000 ms.

In some embodiments, thermal decomposition reaction of the trimethyl gallium is carried out under the following conditions. A pressure of the thermal decomposition reaction is in a range of 22 torr to 27 torr, a temperature of the thermal decomposition reaction is set in a range of 210° C. to 230° C., and a time of the thermal decomposition reaction is set in a range of 2000 ms to 4000 ms.

Sweeping of the trimethyl gallium is carried out under the following conditions. A flow rate of trimethyl gallium (TMGa) is in a range of 8000 sccm to 12000 sccm, a flow rate of ozone ($O_3$) is in a range of 8000 sccm to 12000 sccm, a pressure of the sweeping is in a range of 20 torr to 30 torr, a temperature of the sweeping is in a range of 210° C. to 230° C., and a time of the sweeping is in a range of 4000 ms to 8000 ms.

In some embodiments, sweeping of the trimethyl gallium is carried out under the following conditions. A flow rate of trimethyl gallium (TMGa) is in a range of 9000 sccm to 11000 sccm, a flow rate of ozone ($O_3$) is in a range of 9000 sccm to 11000 sccm, a pressure of the sweeping is in a range of 22 torr to 27 torr, a temperature of the sweeping is in a range of 215° C. to 225° C., and a time of the sweeping is in a range of 5500 ms to 7500 ms.

The first constant temperature process is carried out under the following conditions. The gas in the furnace tube is exhausted under conditions of a constant temperature. A time of the first constant temperature process is in a range of 1000 ms to 3000 ms, a pressure of the first constant temperature process is in a range of 25 torr to 35 torr, and a temperature of the first constant temperature process is in a range of 210° C. to 230° C.

In some embodiments, the first constant temperature process is carried out under the following conditions. A time of the first constant temperature process is in a range of 1500 ms to 2500 ms, a pressure of the first constant temperature process is in a range of 28 torr to 32 torr, and a temperature of the first constant temperature process is in a range of 215° C. to 225° C.

Deposition of ozone is carried out under the following conditions. A flow rate of the ozone is in a range of 3000 sccm to 8000 sccm, a pressure of the deposition is in a range of 20 torr to 30 torr, a temperature of the deposition is in a range of 210° C. to 230° C., and a time of the deposition is in a range of 4000 ms to 8000 ms.

In some embodiments, the deposition of ozone is carried out under the following conditions. A flow rate of the ozone is in a range of 5000 sccm to 7000 sccm, a pressure of the deposition is in a range of 22 torr to 27 torr, a temperature of the deposition is in a range of 215° C. to 225° C., and a time of the deposition is in a range of 5000 ms to 7000 ms.

The thermal decomposition reaction of ozone is carried out under following conditions. A pressure of the thermal decomposition reaction is in a range of 20 torr to 30 torr, a temperature of the thermal decomposition reaction is in a range of 210° C. to 230° C., and a time of the thermal decomposition reaction is in a range of 300 ms to 700 ms.

In some embodiments, the thermal decomposition reaction of ozone is carried out under following conditions. A pressure of the thermal decomposition reaction is in a range of 22 torr to 27 torr, a temperature of the thermal decomposition reaction is in a range of 215° C. to 225° C., and a time of the thermal decomposition reaction is in a range of 400 ms to 600 ms.

Sweeping the ozone is carried out under the following steps. A flow rate of trimethyl gallium is in a range of 8000 sccm to 12000 sccm, a flow rate of ozone is in a range of 8000 sccm to 12000 sccm, a pressure of the sweeping is in a range of 20 torr to 30 torr, a temperature of the sweeping is in a range of 210° C. to 230° C., and a time of the sweeping is in a range of 2000 ms to 6000 ms.

In some embodiments, sweeping the ozone is carried out under the following steps. A flow rate of trimethyl gallium is in a range of 9000 sccm to 11000 sccm, a flow rate of ozone is in a range of 9000 sccm to 11000 sccm, a pressure of the sweeping is in a range of 22 torr to 27 torr, a temperature of the sweeping is in a range of 215° C. to 225° C., and a time of the sweeping is in a range of 3000 ms to 5000 ms.

The second constant temperature process is carried out under the following conditions. The gas in the furnace tube is exhausted under conditions of a constant temperature. A time of the second constant temperature process is in a range of 1000 ms to 3000 ms, a pressure of the second constant temperature process is in a range of 25 torr to 35 torr, and a temperature of the second constant temperature process is in a range of 210° C. to 230° C.

In some embodiments, the second constant temperature process is carried out under the following conditions. A time of the second constant temperature process is in a range of 1500 ms to 2500 ms, a pressure of the second constant temperature process is in a range of 28 torr to 32 torr, and a temperature of the second constant temperature process is in a range of 210° C. to 230° C.

Conditions of vacuuming for the second time includes: setting a reaction time in a range of 10 s to 40 s, setting a temperature in a range of 220° C. to 270° C., and setting the pressure in the device in a range of 15 torr to 25 torr after vacuuming for the second time.

Cleaning the furnace tube after the second vacuuming process and sweeping the residual gas in the furnace tube is carried out under following conditions. A time of the cleaning process is in a range of 10 s to 30 s, a temperature of the cleaning process is in a range of 220° C. to 270° C., a pressure in the furnace tube after the vacuuming process is in a range of 15 torr to 25 torr, a flow rate of inert gas is in a range of 20000 sccm to 30000 sccm.

Then the pressure in the device is recovered to the ordinary pressure and a furnace door opened. A time of the recovering process is in a range of 100 s to 300 s, a temperature of the recovering process is in a range of 220° C. to 270° C., and a flow rate of the inert gas is in a range of 30000 sccm to 70000 sccm.

Finally, the reaction boat is conveyed out of the device to take a sample out. A time of the process is in a range of 100 s to 150 s, and a temperature of the process is in a range of 220° C. to 270° C.

Furthermore, the first antireflection layer 130 and the second antireflection layer 150 can be prepared, but not limited to by the plasma enhanced chemical vapor deposition method (PECVD).

Furthermore, the first electrode 170 and the second electrode 180 can be made, but not limited to by the silk-screen printing method. In some embodiments, electrode plasma is printed at both sides of the substrate and sintered to form a passivating contact structure.

In addition, after the first electrode 170 and the second electrode 180 are prepared, a photoinjection process can be included. Current carriers are injected, so that the hydrogen atoms are passivated and an anti-light failure treatment is carried out.

Furthermore, the present disclosure provides an electrical device, which includes a solar battery described above as a power supply. The electrical device can include but not limited to transformers, electric reactors, capacitors, composite apparatus, circuit breakers, mutual inductors, arresters, coupling capacitors, transmission lines, power cables, grounding devices, generators, compensators, electromotors, enclosed busbars and thyristors.

The solar battery of the present disclosure will be further described in details in conjunction with the embodiments hereinafter.

First Embodiment

Figure 3:
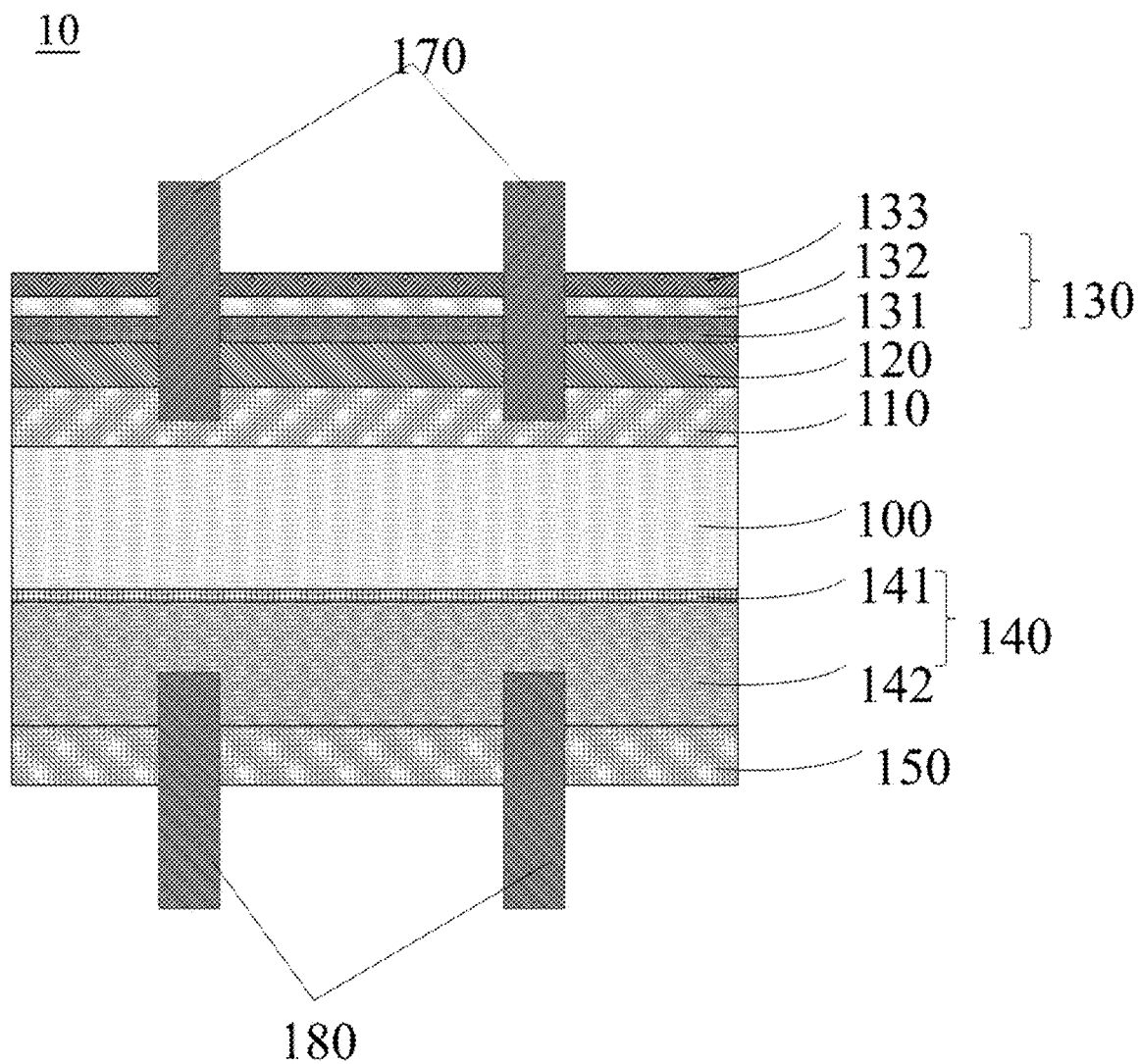
FIG. 3 is a structural schematic diagram of a solar battery in an embodiment of the present disclosure.

Referring to FIG. 3, the present embodiment provided a solar battery, which included an N-type silicon substrate. One side of the N-type silicon substrate was successively provided with a P-type emission layer made of boron diffusion and a first passivating layer of gallium oxide. The first passivating layer was provided with a first antireflection layer successively including silicon nitride, silicon oxynitride and silicon oxide. The other side of the N-type silicon substrate was successively provided with a tunnelling oxide layer, a doped polycrystal silicon layer made of phosphorus diffusion and a second antireflection layer made of silicon nitride. The one-dimensional β-$Ga_2O_3$ structure in the first passivating layer was prepared by following steps.

First step: conveying a reaction boat into a device. The silicon wafer was placed on an aluminium clamping apparatus, and conveyed into an ALD device with a mechanical arm. A reaction time was set to 120 s and the temperature was set to 250° C.

Second step: a vacuuming process. The furnace tube was subjected to vacuuming for the first time. A time of the vacuuming was set to 200 s and a temperature of the vacuuming was set to 220° C.

Third step: heating. The pressure in the furnace tube was adjusted to a preset processing value, and the furnace tube was subjected to thermal isolation. A time of the thermal isolation was set to 300 s, a temperature of the thermal isolation was set to 220° C., and a pressure of the thermal isolation was 30 torr.

Fourth step: checking to make sure that the device is not leaky. Thus, a processing effect could be guaranteed. A time of the checking was set to 20 s, a temperature of the checking was set to 220° C., and a pressure of the checking was 30 torr.

Fifth step: pre-ventilation. A gas was pre-blown into a pipeline of the ALD device. A time of the pre-ventilation was set to 10 s, a flow rate of trimethyl gallium (TMGa) was 10000 sccm, and a flow rate of ozone ($O_3$) was 10000 sccm.

Sixth step: subjecting the trimethyl gallium to thermal decomposition deposition. The trimethyl gallium was blown into the furnace tube. A time of the thermal decomposition deposition was set to 4000 ms, a temperature of the thermal decomposition deposition was set to 220° C., a pressure of the thermal decomposition deposition was 25 torr, and a flow rate of the trimethyl gallium was 5000 sccm.

Seventh step: a stable thermal decomposition reaction of the trimethyl gallium. A time of the thermal decomposition reaction was set to 3000 ms, a temperature of the thermal decomposition reaction was set to 220° C., and a pressure of the thermal decomposition reaction was 25 torr.

Eighth step: sweeping the trimethyl gallium (TMGa). A time of the sweeping was set to 6500 ms, a temperature of the sweeping was set to 220° C., a pressure of the sweeping was 25 torr, a flow rate of trimethyl gallium (TMGa) was 10000 sccm, and a flow rate of ozone ($O_3$) was 10000 sccm.

Ninth step: a constant temperature process. The gas in the furnace tube was exhausted under conditions of a constant temperature. A time of the constant temperature process was set to 2000 ms, a temperature of the constant temperature process was set to 220° C., and a pressure of the first constant temperature process was 30 torr.

Tenth step: subjecting the ozone ($O_3$) to thermal decomposition deposition depositing. The ozone ($O_3$) was blown into the furnace tube. A time of the thermal decomposition deposition was set to 6000 ms, a temperature of the thermal decomposition deposition was set to 220° C., a pressure of the thermal decomposition deposition was 25 torr, and a flow rate of the ozone was 6000 sccm.

Eleventh step: a stable thermal decomposition reaction of the ozone ($O_3$). A time of the thermal decomposition reaction was set to 500 ms, a temperature of the thermal decomposition reaction was set to 220° C., and a pressure of the thermal decomposition deposition was 25 torr.

Twelfth step: sweeping the ozone ($O_3$). A time of the sweeping was set to 4000 ms, a temperature of the sweeping was set to 220° C., a pressure of the sweeping was 25 torr, a flow rate of trimethyl gallium (TMGa) was 10000 sccm, and a flow rate of ozone ($O_3$) was 10000 sccm.

Thirteenth step: a constant temperature process. The gas in the furnace tube was exhausted under conditions of a constant temperature. A time of the constant temperature process was set to 2000 ms, a temperature of the constant temperature process was set to 220° C., and a pressure of the constant temperature process was 30 torr.

The sixth step to the thirteenth step were regarded as one reaction circulation. 30 reaction circulations should be carried out to prepare a gallium oxide dielectric layer.

Fourteenth step: a vacuuming process. The residual reaction gas was exhausted. A time of the vacuuming process was set to 25 s, a temperature of the vacuuming process was set to 250° C., and a pressure of the vacuuming process was 20 torr.

Fifteenth step: cleaning the furnace tube. The residual gas in the furnace was swept out with nitrogen. A time of the cleaning process was set to 15 s, a temperature of the cleaning process was set to 250° C., a pressure of the cleaning process was 20 torr, and a flow rate of the nitrogen was 25000 sccm.

Sixteenth step: recovering to the ordinary pressure. The pressure in the device was recovered to the ordinary pressure to open the device. A time of the recovering process was set to 200 s, a temperature of the recovering process was set to 250° C., and a flow rate of the nitrogen ($N_2$) was 50000 sccm.

Seventeenth step: conveying the reaction boat out of the device. The aluminium clamping apparatus was conveyed out of the ALD device with the mechanical arm. A reaction time was set to 120 s and the temperature was set to 250° C.

Second Embodiment

Figure 4:
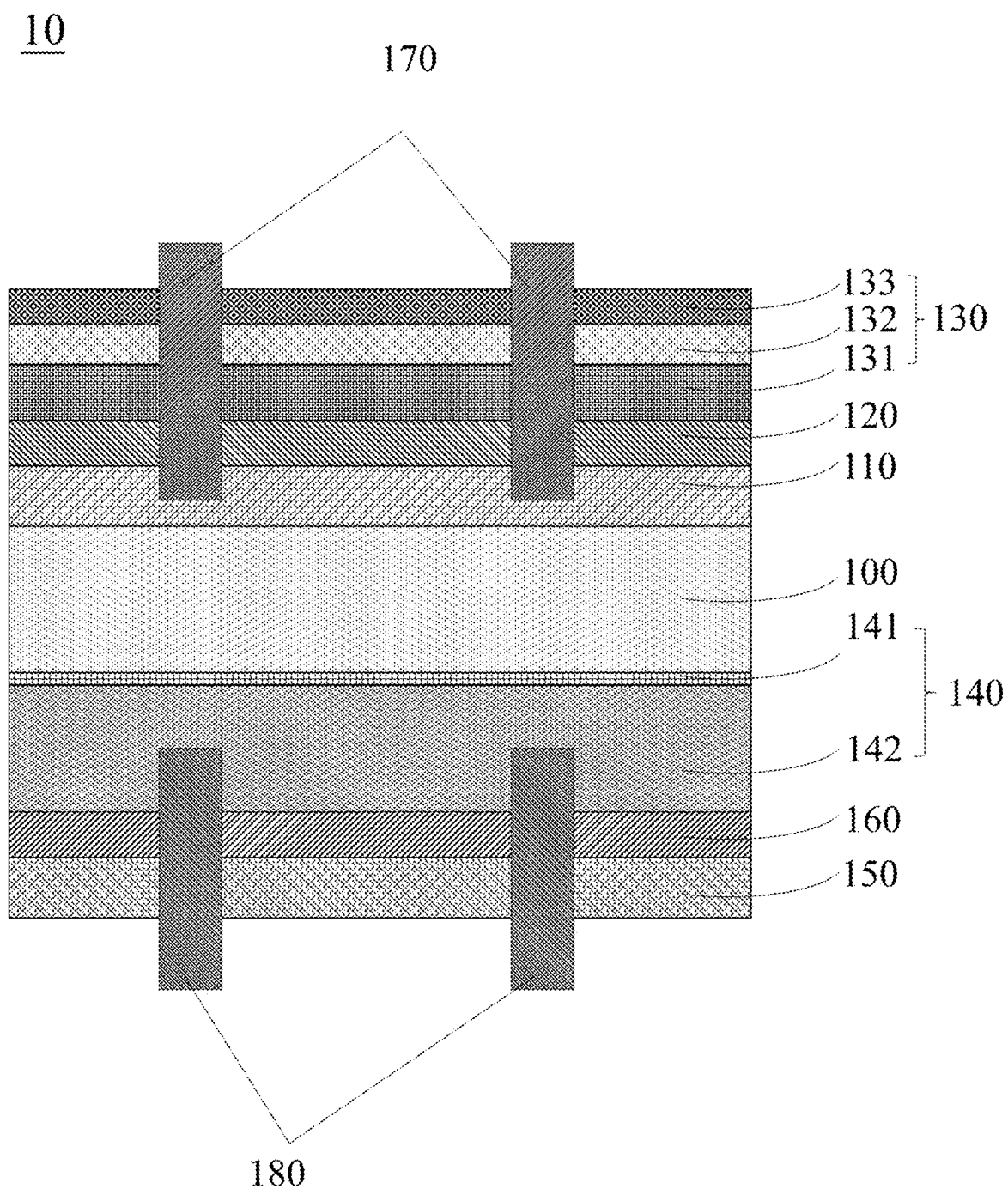
FIG. 4 is a structural schematic diagram of a solar battery in an embodiment of the present disclosure.

Referring to FIG. 4, the present embodiment provided a solar battery. The solar battery included a gallium oxide as a second passivating layer between the doped polycrystal silicon layer and the second antireflection layer on the basis of the first embodiment. A method for preparing the second passivating layer was the same as that of the first passivating layer.

Third Embodiment

Figure 5:
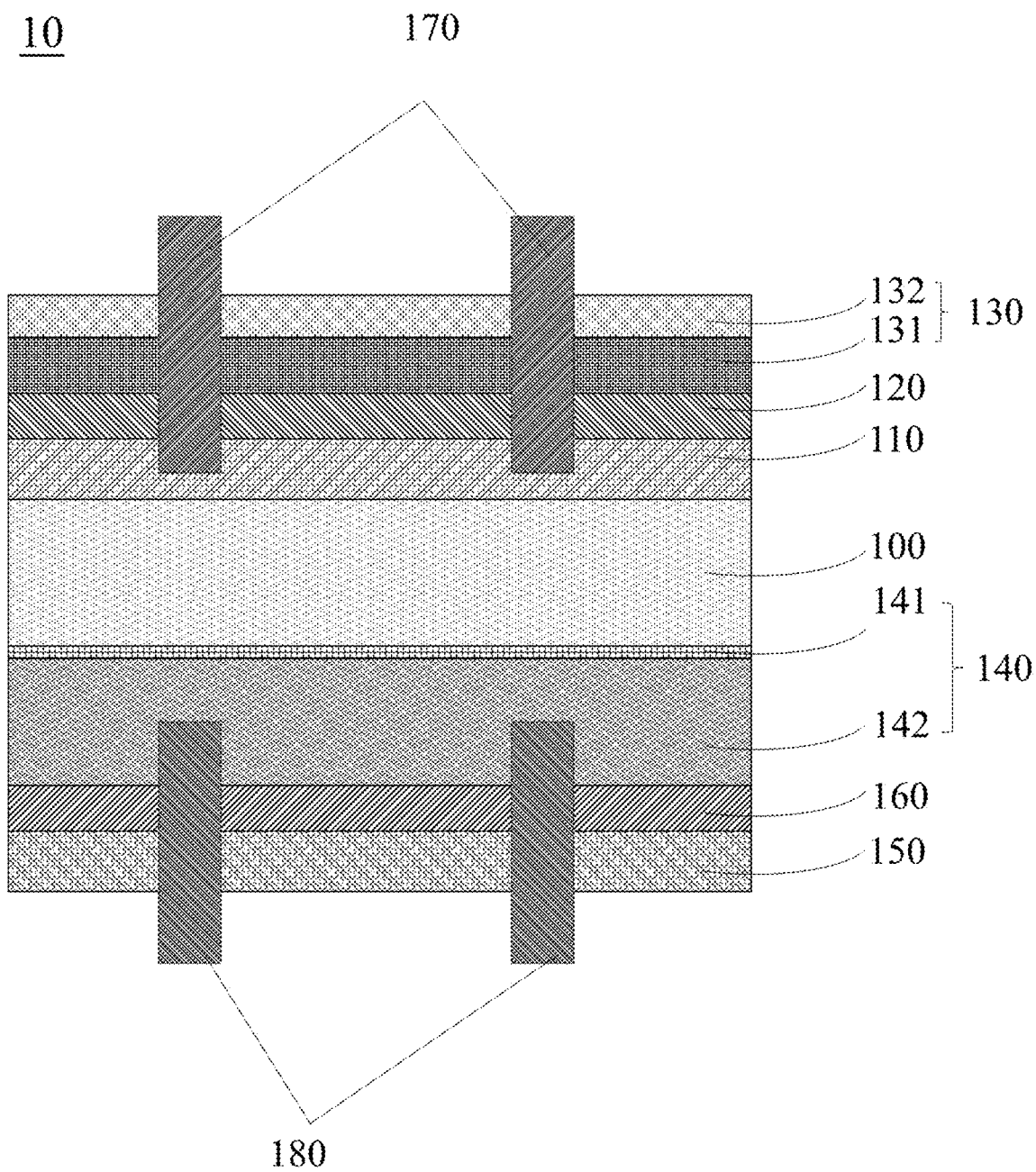
FIG. 5 is a structural schematic diagram of a solar battery in an embodiment of the present disclosure.

Referring to FIG. 5, the present embodiment provided a solar battery. The differences between the solar battery of the present embodiment and the solar battery of the second embodiment were: the first passive layer of the present embodiment included a gallium oxide layer, a silicon nitride and a silicon oxynitride layer, and the gallium oxide layer, the silicon nitride and the silicon oxynitride layer were successively provided; and the first antireflection layer of the present embodiment included a gallium oxide layer, a silicon nitride and a silicon oxynitride layer, and the gallium oxide layer, the silicon nitride and the silicon oxynitride layer were successively provided.

Fourth Embodiment

Figure 6:
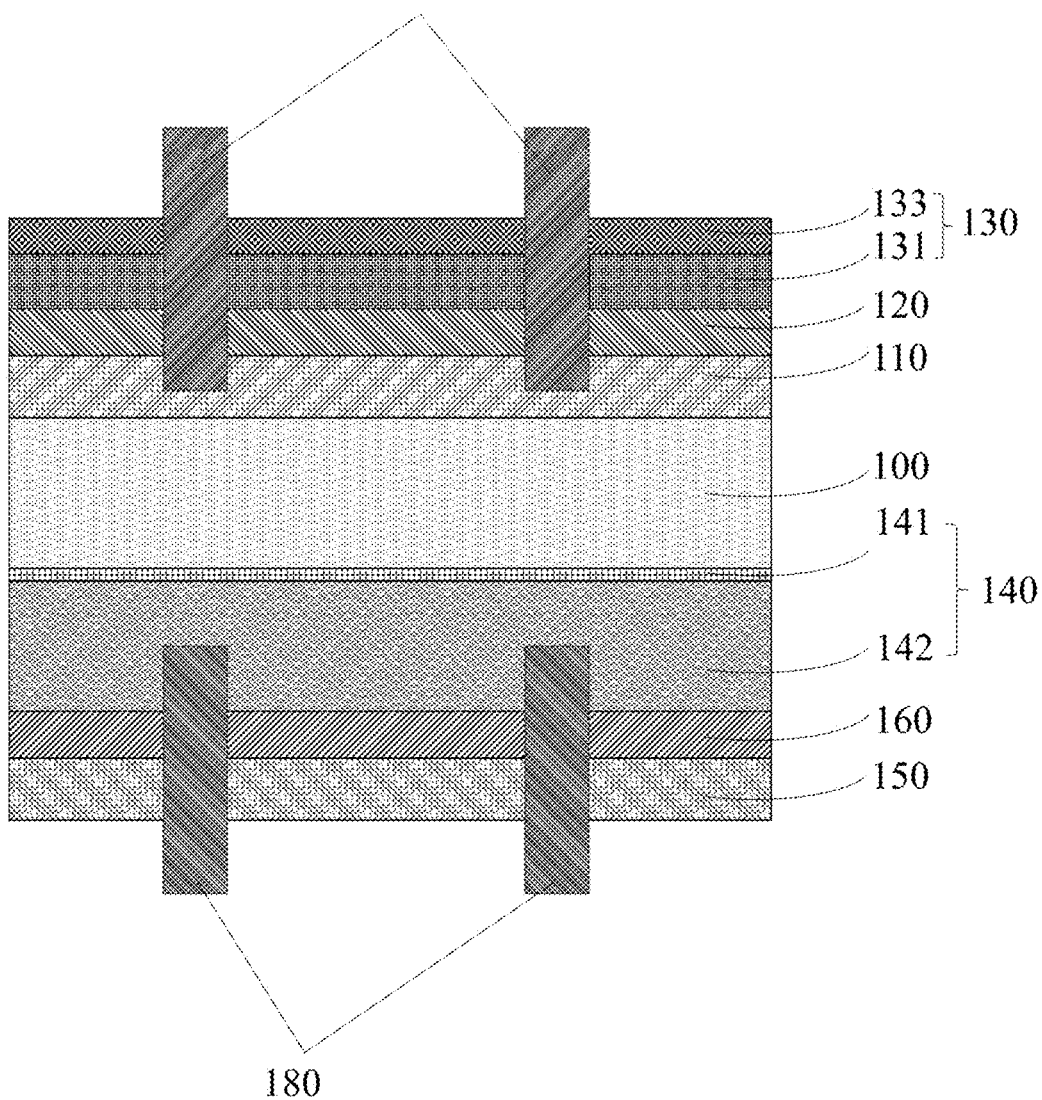
FIG. 6 is a structural schematic diagram of a solar battery in an embodiment of the present disclosure.

Referring to FIG. 6, the present embodiment provided a solar battery. The differences between the solar battery of the present embodiment and the solar battery of the second embodiment were: first passivating layer of the present embodiment included a gallium oxide layer, a silicon nitride layer, and a silicon oxide layer, and the gallium oxide layer, the silicon nitride layer and the silicon oxide layer were successively provided; and first antireflection layer of the present embodiment included a gallium oxide layer, a silicon nitride layer, and a silicon oxide layer, and the gallium oxide layer, the silicon nitride layer and the silicon oxide layer were successively provided.

First Comparative Embodiment

The present comparative embodiment provided a solar battery. The difference between the solar battery of the present comparative embodiment and the solar battery of the first embodiment was that a material of the first passivating layer of the present solar battery was aluminium oxide.

Second Comparative Embodiment

The present comparative embodiment provided a solar battery. The difference between the solar battery of the present comparative embodiment and the solar battery of the second embodiment is that a material of the first passivating layer and a material of the second passivating layer of the present solar battery was aluminium oxide.

Third Comparative Embodiment

The present comparative embodiment provided a solar battery. The difference between the solar battery of the present comparative embodiment and the second embodiment were: the first passivating layer of the present comparative embodiment included a gallium oxide layer, a silicon oxynitride layer and a silicon oxide layer, and the gallium oxide layer, the silicon oxynitride layer and the silicon oxide layer were successively provided; and the first antireflection layer of the present comparative embodiment included a gallium oxide layer, a silicon oxynitride layer and a silicon oxide layer, and the gallium oxide layer, the silicon oxynitride layer and the silicon oxide layer were successively provided.

Fourth Comparative Embodiment

The present comparative embodiment provided a solar battery. The difference between the solar battery of the present comparative embodiment and the second embodiment were: the first passivating layer of the present comparative embodiment included a gallium oxide layer and a silicon oxynitride layer, and the gallium oxide layer and the silicon oxynitride layer were successively provided; and the first antireflection layer of the present comparative embodiment included a gallium oxide layer and a silicon oxynitride layer, and the gallium oxide layer and the silicon oxynitride layer were successively provided.

Fifth Comparative Embodiment

The present comparative embodiment provided a solar battery. The difference between the solar battery of the present comparative embodiment and the second embodiment were: the first passivating layer of the present comparative embodiment included a gallium oxide layer and a silicon oxide layer, and the gallium oxide layer and the silicon oxide layer were successively provided; and the first antireflection layer of the present comparative embodiment included a gallium oxide layer and a silicon oxide layer, and the gallium oxide layer and the silicon oxide layer were successively provided.

Parameters of the solar batteries prepared in the first embodiment to the fourth embodiment and the first comparative embodiment to the fifth comparative embodiment were tested. The parameters included a conversion efficiency (Eta), an open-circuit voltage (Uoc), a short-circuit current (Isc), a fill factor (FF), a maximum operating voltage (Umpp), a maximum operating current (Impp), a maximum operating power (Pmpp), and a power loss. The tests were carried out on the basis of *IEC TS* 63202-3 *Photovoltaic cells-Part 3: Measurement of current-voltage characteristics of bicial photovoltaic cells.*

The solar batteries prepared in the above embodiments and the above comparative embodiments were subjected to a test of transfer efficiency, and the results were shown in the table herein.

| Embodiments | Structure of the passivating layer | Eta(%) | Uoc(V) | Isc(A) | FF |
|---|---|---|---|---|---|
| First Comparative Embodiment | Aluminium Oxide - a one-side membrane structure at front side | 25.00 | 0.7149 | 13.849 | 83.36 |
| Second Comparative Embodiment | Aluminium Oxide - bifacial membrane structure at front side/back side | 24.99 | 0.7152 | 13.842 | 83.33 |
| First Embodiment | gallium oxide - a one-side membrane structure at front side | 25.02 | 0.7154 | 13.845 | 83.41 |
| Second Embodiment | gallium oxide - bifacial membrane structure at front side/back side | 25.00 | 0.7151 | 13.843 | 83.38 |

It could be concluded from the table above that introducing a dielectric layer made of gallium oxide did not affect a final transfer efficiency of the TOPCon solar battery, and the TOPCon solar battery had a relatively high transfer efficiency of 25%.

The solar batteries prepared in the above embodiments and the above comparative embodiments were subjected to test under conditions of 85° C. and a humidity of 85%.

| Embodiments | Comment | Structure of the passivating layer | Power loss % | Uoc(V) | Isc(A) | Umpp(V) | Impp(A) | Pmpp(W) | FF | Change of power % |
|---|---|---|---|---|---|---|---|---|---|---|
| First Comparative Embodiment | Initial DH 1000 h | Aluminium Oxide - a one-side membrane structure at front side | −1.49 | 41.623 41.722 | 11.617 11.470 | 34.808 34.931 | 11.108 10.903 | 386.629 380.851 | 79.96 79.59 | −1.49 |
| Second Comparative Embodiment | Initial DH 1000 h | Aluminium Oxide - bifacial membrane structure at front side/back side | −1.33 | 41.543 41.606 | 11.539 11.416 | 34.517 34.595 | 11.082 10.910 | 382.526 377.436 | 79.80 79.46 | −1.33 |
| First Embodiment | Initial DH 1000 h | gallium oxide - a one-side membrane structure at front side | −0.92 | 41.692 41.685 | 11.675 11.647 | 34.770 34.749 | 11.211 11.156 | 389.801 386.219 | 80.08 79.55 | −0.92 |
| Second Embodiment | Initial DH 1000 h | gallium oxide - bifacial membrane structure at front side/back side | −0.73 | 41.453 41.554 | 11.220 11.186 | 34.744 34.890 | 10.706 10.582 | 371.952 369.219 | 79.97 79.43 | −0.73 |

It could be concluded from the table above that after the material of the passivating layer was changed, performances of the TOPCon solar battery under conditions of high temperature and high humidity were obviously improved, and reliability of devices could be effectively improved.

The solar batteries prepared in the above embodiments and the above comparative embodiments were subjected to an attenuation test under UV light for 200 hours, and the results were shown in the table hereinafter.

| Embodiments | Comment | Structure of the passivating layer | Power loss % | Uoc(V) | Isc(A) | FF | Eta(%) |
|---|---|---|---|---|---|---|---|
| First Comparative Embodiment | Initial UV 200 h | Aluminium Oxide-a one-side membrane structure at front side | −1.59% | 0.717 0.713 | 13.963 13.828 | 83.168 83.099 | 25.208 24.806 |
| Second Comparative Embodiment | Initial UV 200 h | Aluminium Oxide-bifacial membrane structure at front side/back side | −1.43% | 0.716 0.713 | 13.914 13.796 | 83.526 83.416 | 25.211 24.851 |
| First Embodiment | Initial UV 200 h | gallium oxide - a one-side membrane structure at front side | −0.95% | 0.717 0.714 | 13.948 13.898 | 83.477 83.409 | 25.297 25.057 |
| Second Embodiment | Initial UV 200 h | gallium oxide - bifacial membrane structure at front side/back side | −0.79% | 0.716 0.714 | 13.859 13.798 | 82.898 82.884 | 24.917 24.721 |

It could be concluded from the table above that after the material of the passivating layer was changed, the TOPCon solar battery could maintain well device performances even after exposed under the UV light for a long time.

The gallium oxide has a low interface state density and a high fixed amount of negative charges. Thus, a front side of the TOPCon solar battery can have a relatively strong interface field passivation effect, and transfer efficiency of the TOPCon solar battery can be high. In addition, the gallium oxide has good water stability, which can effectively avoid failure of the solar battery caused by increasing contact resistance after the passivating layer absorbing water. The passivating layer made of gallium oxide can effectively absorb ultraviolet light, improve stability of a bond energy of $H^+$ bond after the solar battery is exposed under the sun in the outdoor after a long time, improve stability of $H^+$ passivation, and effectively avoid the problem of failure of the solar battery caused by the strong ultraviolet light. It could be understood that the $H^+$ bond herein represents the $H^+$ bonds generated in the reaction between $SiH_4$, $NH_3$ and $(CH_3)_3Ga$.

Furthermore, TOPCon solar battery provided with gallium oxide at both sides of the substrate were tested. In the second embodiment to the fourth embodiment and the third comparative embodiment to the fifth comparative embodiment, solar batteries were provided with different first antireflection layers. The solar batteries were subjected performance tests, and the results were shown the table hereinafter. By providing a composited passivating layer made by contacting the gallium oxide in the passivating layer with the silicon nitride in the antireflection layer, the chemical passivation and field passivation on a surface of the battery were improved, so as to effectively improve a service life of minority carriers of the solar battery and the transfer efficiency of the solar battery.

| Embodiments | Structures of the first passivating layer and the first antireflection layer | Eta(%) | Uoc(V) | Isc(A) | FF |
|---|---|---|---|---|---|
| Third Comparative Embodiment | Gallium Oxide + Silicon Oxynitride + Silicon Oxide | 23.03 | 0.7092 | 13.375 | 80.15 |
| Fourth Comparative Embodiment | Gallium Oxide + Silicon Oxynitride | 23.01 | 0.7053 | 13.385 | 80.48 |
| Fifth Comparative Embodiment | Gallium Oxide + Silicon Oxide | 22.94 | 0.7035 | 13.413 | 80.27 |
| Second Embodiment | Gallium Oxide + Silicon Nitride + Silicon Oxynitride + Silicon Oxide | 25.22 | 0.7178 | 13.913 | 83.37 |
| Third Embodiment | Gallium Oxide + Silicon Nitride + Silicon Oxynitride | 25.14 | 0.7166 | 13.882 | 83.45 |
| Fourth Embodiment | Gallium Oxide + Silicon Nitride + Silicon Oxide | 25.02 | 0.7148 | 13.875 | 83.29 |

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A solar battery, comprising a substrate,
   wherein one side of the substrate is successively provided with an emission layer, a first passivating layer and a first antireflection layer, and the other side of the substrate is successively provided with a passivating contact structure, a second passivating layer and a second antireflection layer; and
   a material of the first passivating layer comprises gallium oxide, and
   a material of the second passivating layer comprises gallium oxide.

2. The solar battery of claim 1, wherein the passivating contact structure comprises a tunnelling oxide layer and a doped polycrystal silicon layer successively disposed, and the tunnelling oxide layer is located adjacent to the substrate.

3. The solar battery of claim 1, wherein the first antireflection layer comprises a silicon nitride layer, a silicon oxynitride layer, a silicon oxide, or any combination thereof, and
   the second antireflection layer comprises a silicon nitride layer, a silicon oxynitride layer, a silicon oxide layer, or any combination thereof.

4. The solar battery of claim 3, wherein the first antireflection layer comprises a first silicon nitride layer, and the first silicon nitride layer is in contact with the first passivating layer.

5. The solar battery of claim 1, further comprising a first electrode and a second electrode, wherein the first electrode extends through the first passivating layer and the first antireflection layer and is in contact with the emission layer, and the second electrode extends through the second antireflection layer and is in contact with the passivating contact structure.

6. A method for preparing the solar battery of claim 1, comprising following steps:
   successively preparing an emission layer, a first passivating layer and a first antireflection layer on one side of the substrate, and successively preparing a passivating contact structure a second passivating layer and a second antireflection layer on the other side of the substrate.

7. The method of claim 6, wherein the first passivating layer is prepared by a method selected from an atomic layer deposition method, a plasma enhanced chemical vapour deposition method, and a physical vapour deposition method.

8. The method of claim 6, wherein after the step of preparing the first passivating layer, a second passivating layer is prepared on the passivating contact structure.

9. The method of claim 8, wherein conditions for preparing the first passivating layer by the atomic layer deposition method comprises: under a gas atmosphere of trimethyl gallium and ozone, a volume flow rate of the trimethyl gallium being in a range of 3000 sccm to 12000 sccm, a volume flow rate of the ozone being in a range of 4000 sccm to 12000 sccm, a reaction temperature being in a range of 210° C. to 230° C., and a reaction pressure being in a range of 20 torr to 35 torr; and
   conditions for preparing the second passivating layer by the atomic layer deposition method comprises: under a gas atmosphere of trimethyl gallium and ozone, a volume flow rate of the trimethyl gallium being in a range of 3000 sccm to 12000 sccm, a volume flow rate of the ozone being in a range of 4000 sccm to 12000 sccm, a reaction temperature being in a range of 210° C. to 230° C., and a reaction pressure being in a range of 20 torr to 35 torr.

10. The method of claim 8, wherein the method for preparing the first passivating layer by the atomic layer deposition method comprises the following steps: conveying a reaction boat into a device; vacuuming for the first time; heating to a processing temperature and isolating; checking to make sure that the device is not leaky; pre-ventilation; depositing trimethyl gallium; thermal decomposition reaction of the trimethyl gallium; sweeping the trimethyl gallium; a first constant temperature process; depositing ozone; thermal decomposition reaction of the ozone; sweeping the ozone; a second constant temperature process; vacuuming for the second time; cleaning a furnace tube; recovering a pressure in the furnace tube to an ordinary pressure; and conveying the reaction boat out of the device; and
   the method for preparing the second passivating layer by the atomic layer deposition method comprises the following steps: conveying a reaction boat into a device; vacuuming for the first time; heating to a processing temperature and isolating; checking to make sure that the device is not leaky; pre-ventilation; depositing the trimethyl gallium; thermal decomposition reaction of the trimethyl gallium; sweeping the trimethyl gallium; a first constant temperature process; depositing the ozone; thermal decomposition reaction of the ozone; sweeping the ozone; a second constant temperature process; vacuuming for the second time; cleaning a furnace tube; recovering a pressure in the furnace tube to an ordinary pressure; and conveying the reaction boat out of the device.

11. The method of claim 10, wherein a method for preparing gallium oxide passivating layer with different thicknesses comprises circulations of the following steps: depositing trimethyl gallium; thermal decomposition reaction of the trimethyl gallium; sweeping the trimethyl gallium; a first constant temperature process; depositing ozone; thermal decomposition reaction of the ozone; sweeping the ozone; and a second constant temperature process, and the number of the circulations is in a range of 20 times to 40 times.

12. The method of claim 10, wherein the step of depositing the trimethyl gallium is carried out under the following conditions: a flow rate of the trimethyl gallium is in a range of 3000 sccm to 8000 sccm, a pressure of the step of depositing the trimethyl gallium is in a range of 20 torr to 30 torr, a temperature of the step of depositing the trimethyl gallium is set in a range of 210° C. to 230° C., and a time of the step of depositing the trimethyl gallium is in a range of 2000 ms to 6000 ms.

13. The method of claim 10, wherein the thermal decomposition reaction of the trimethyl gallium is carried out under the following conditions: a pressure of the thermal decomposition reaction is in a range of 20 torr to 30 torr, a temperature of the thermal decomposition reaction is set in a range of 210° C. to 230° C., and a time of the thermal decomposition reaction is set in a range of 2000 ms to 5000 ms.

14. The method of claim 10, wherein the step of sweeping the trimethyl gallium is carried out under the following conditions: a flow rate of trimethyl gallium is in a range of 8000 sccm to 12000 sccm, a flow rate of ozone is in a range of 8000 sccm to 12000 sccm, a pressure of the step of sweeping the trimethyl gallium is in a range of 20 torr to 30 torr, a temperature of the step of sweeping the trimethyl gallium is in a range of 210° C. to 230° C., and a time of the step of sweeping the trimethyl gallium is in a range of 4000 ms to 8000 ms.

15. The method of claim 10, wherein the first constant temperature process is carried out under the following conditions: a time of the first constant temperature process is in a range of 1000 ms to 3000 ms, a pressure of the first constant temperature process is in a range of 25 torr to 35 torr, and a temperature of the first constant temperature process is in a range of 210° C. to 230° C.

16. The method of claim 10, wherein the step of depositing the ozone is carried out under the following conditions: a flow rate of the ozone is in a range of 3000 sccm to 8000 sccm, a pressure of the step of depositing the ozone is in a range of 20 torr to 30 torr, a temperature of the step of depositing the ozone is in a range of 210° C. to 230° C., and a time of the step of depositing the ozone is in a range of 4000 ms to 8000 ms.

17. The method of claim 10, wherein the thermal decomposition reaction of the ozone is carried out under following conditions: a pressure of the thermal decomposition reaction of the ozone is in a range of 20 torr to 30 torr, a temperature of the thermal decomposition reaction of the ozone is in a range of 210° C. to 230° C., and a time of the thermal decomposition reaction of the ozone is in a range of 300 ms to 700 ms.

18. The method of claim 10, wherein the step of sweeping the ozone is carried out under the following conditions: a flow rate of trimethyl gallium is in a range of 8000 sccm to 12000 sccm, a flow rate of ozone is in a range of 8000 sccm to 12000 sccm, a pressure of the sweeping is in a range of 20 torr to 30 torr, a temperature of the sweeping is in a range of 210° C. to 230° C., and a time of the sweeping is in a range of 2000 ms to 6000 ms.

19. An electrical device, comprising the solar battery of claim 1 as a power supply.

* * * * *